US006590406B2

(12) United States Patent
Okuno et al.

(10) Patent No.: US 6,590,406 B2
(45) Date of Patent: Jul. 8, 2003

(54) APPARATUS FOR INSPECTING DISPLAY BOARD OR CIRCUIT BOARD

(75) Inventors: Toshio Okuno, Kanagawa-ken (JP); Gunji Mizutani, Tokyo (JP); Masatomo Nagashima, Kanagawa-ken (JP); Tadashi Furumi, Mishima-machi (JP)

(73) Assignees: Soshotech Co., Ltd, Kanagawa-Ken (JP); Adtec Engineering Co., Ltd., Tokyo (JP)

( * ) Notice: Subject to any disclaimer, the term of this patent is extended or adjusted under 35 U.S.C. 154(b) by 0 days.

(21) Appl. No.: 09/974,895

(22) Filed: Oct. 12, 2001

(65) Prior Publication Data

US 2002/0043982 A1 Apr. 18, 2002

(30) Foreign Application Priority Data

Oct. 16, 2000 (JP) ....................................... 2000-315081

(51) Int. Cl.[7] ............................................... G01R 31/02
(52) U.S. Cl. ..................... 324/762; 324/761; 324/158.1
(58) Field of Search .............................. 324/761, 158.1, 324/754–765

(56) References Cited

U.S. PATENT DOCUMENTS 4,841,231 A * 6/1989 Angelucci ................... 324/528
5,192,908 A * 3/1993 Shibata ....................... 324/761
5,218,292 A * 6/1993 Goto .......................... 324/761
6,420,884 B1 * 7/2002 Khoury et al. .............. 324/754
6,450,469 B1 * 9/2002 Okuno .................. 248/346.01

* cited by examiner

*Primary Examiner*—Kamand Cuneo
*Assistant Examiner*—Tung X. Nguyen
(74) *Attorney, Agent, or Firm*—Wenderoth, Lind & Ponack, L.L.P.

(57) ABSTRACT

An apparatus for inspecting a display board or a circuit board in which an inspection terminal 4 of an inspection probe block B is pressed into contact with an electrode pad 3 of a display board or a circuit portion P for inspection. A probe block supporting frame member 2 has an expandable and contractible structure, and when the probe block supporting frame member 2 is expanded, a board supporting frame member 1 can be relatively advanced. Due to the relative advancement of the board supporting frame member 1, the display board or the circuit board P protrudes forward of a distal end of the terminal 4 of the probe block B through an enlarged opening area 16 of the probe supporting frame member 2, so that the display board or the circuit board P supported on the board supporting frame member 1 can be exchanged with another board.

4 Claims, 6 Drawing Sheets

APPARATUS FOR INSPECTING DISPLAY BOARD OR CIRCUIT BOARD

BACKGROUND OF THE INVENTION

1. Field of the Invention

This invention relates to an apparatus for inspecting a display board or a circuit board, and more particularly to a mechanism for exchanging a display board or a circuit board in an inspection apparatus.

2. Related Art

Conventionally, an inspection of a display board or a circuit board as represented by a liquid crystal panel and a plasma display panel is carried out in the following manner. As shown in FIGS. 1 and 2, a block probe supporting frame member 2 for supporting an inspection probe block B thereon is arranged at a front side of a display board or circuit board P, and a board supporting frame member 1 for supporting the display board or the circuit board P thereon is arranged at a rear side of the board. The board supporting frame member 1 arranged at the rear side is relatively movably arranged for advancement and retraction with respect to the probe block supporting frame member 20. An inspection terminal 4 of the inspection probe block B supported on the board supporting frame member 1 is pressed into contact, for inspection, with an electrode pad 3 of the display board or the circuit board P supported on the board supporting frame member 1 by advancement of the board supporting frame member 1. After the completion of the inspection, the board supporting frame member 1 is retracted/retreated sideways so that the display board or the circuit board P can be exchanged with another board.

Accordingly, the conventional inspection apparatus needs an occupation space for exchange of boards in addition to an occupation space for the inspection of the display board or the circuit board. For this reason, the conventional inspection apparatus is inevitably made large in size.

SUMMARY OF THE INVENTION

It is, therefore, an object of the present invention to provide an apparatus for inspecting a display board or a circuit board, in which no occupation space for exchanging a display board or a circuit board is needed. In addition, the apparatus for inspecting the display board or the circuit board can be miniaturized, and a display board or a circuit board can easily and safely be exchanged at a front surface of a probe block supporting frame member without creating interference between an inspection terminal of a probe block and a display board or a circuit board.

In order to achieve the above object, according to the present invention, there is provided an apparatus for inspecting a display board or a circuit board, wherein the probe block supporting frame member has an enlargable and reducible structure. In particular, the probe block supporting frame member can be enlarged and the board supporting frame member can be relatively advanced, and by the relative advancement of the board supporting frame member, the display board or the circuit board is caused to protrude forward of a distal end of the terminal of the probe block through an enlarged opening portion of the probe supporting frame member. Therefore, the display board or the circuit board supported on the board supporting frame member can be exchanged with another board.

DETAILED DESCRIPTION OF THE INVENTION

One embodiment of the present invention will be described hereinafter with reference to FIGS. 1 to 10. An apparatus for inspecting a display board or a circuit board according to this embodiment comprises, as illustrated in FIG. 3, a probe block supporting frame member 2 having an enlargable (expandible) and reducible (contractible) structure on which an inspection probe block B is supported, and a board supporting frame member 1 on which a display board or a circuit board P (as an object to be inspected) is supported. The probe block supporting frame member 2 on which the inspection probe block B is supported is arranged at a front part of the board, and the board supporting frame member 1 on which the display board or the circuit board P is supported is arranged at a rear part of the board. The board supporting frame member 1 located at a rear part and the probe supporting frame member 2 located at a front part are relatively movably arranged for advancement and retraction.

The probe block B is composed of a plate or sheet having a plurality of leads arranged in array thereon and adhered to a folder block. One end of each lead protrudes from the folder block to form a terminal 4. The terminal 4 is pressed into contact with an electrode pad 3 of the display board or the circuit board P. A relation between each terminal 4 and each electrode pad 3 is the same as that shown in FIGS. 1 and 2.

Figure 7:
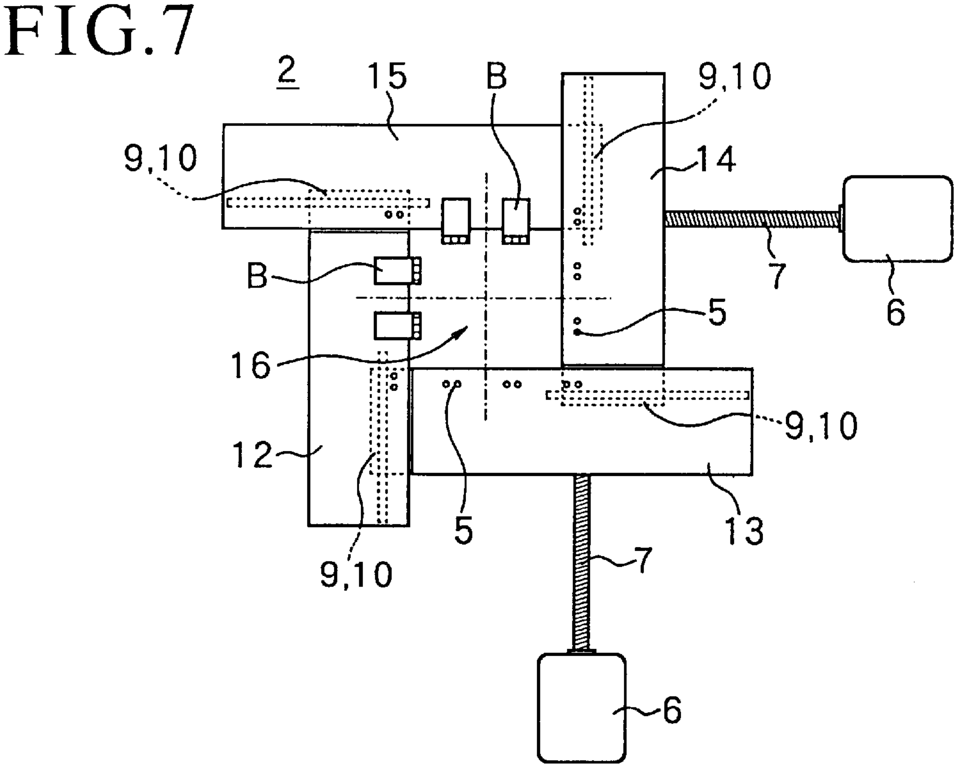
FIG. 7 is a front view showing a reduced (contracted) state of a probe supporting frame member which is cross assembled.
Figure 8:
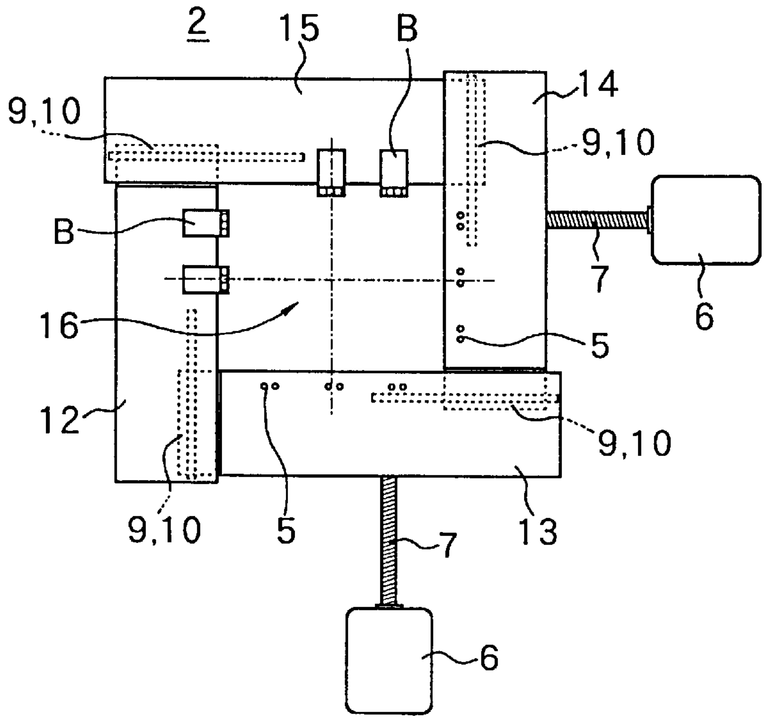
FIG. 8 is a front view showing an enlarged (expanded) state of a cross assembled probe supporting frame member.

As shown in FIGS. 7 and 8, the probe supporting frame member 2 is provided with an attachment means such as attachment hole 5 for threadingly attaching the probe block B. The probe block B is threadingly attached to the probe supporting frame member 2 such that the terminals 4 protrude from the probe block B towards an opening area 16 of the frame member 2.

Figure 5A:
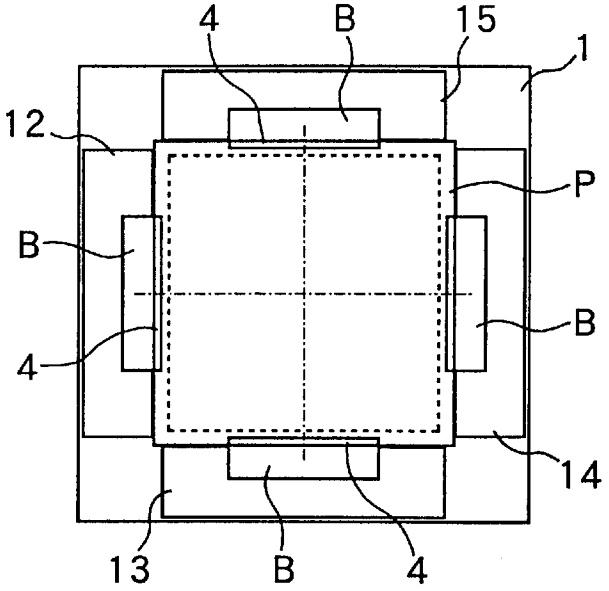
FIG. 5(A) is a front view showing a relative arrangement between a probe supporting frame member which is in an enlarged state and a board supporting frame member when in a standby position for inspection.
Figure 5B:
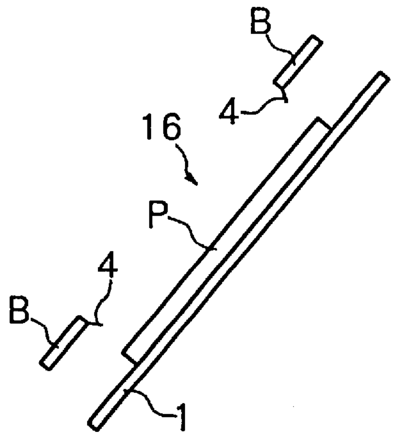
FIG. 5(B) is a sectional view thereof.
Figure 6A:
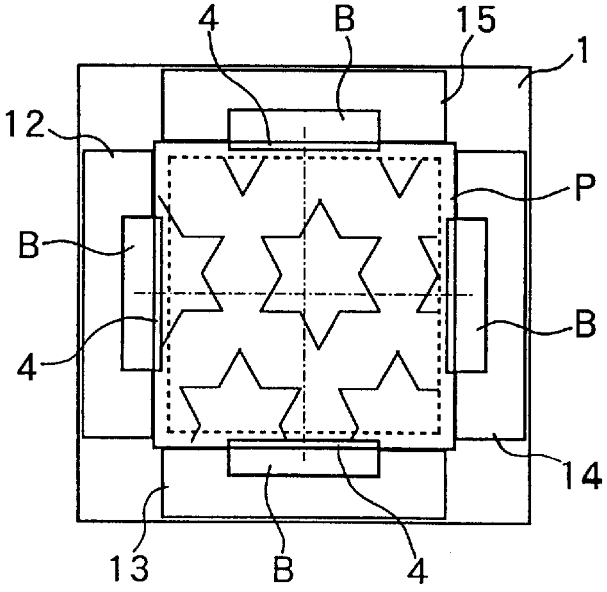
FIG. 6(A) is a front view showing a relative arrangement between a probe supporting frame member which is in an reduced (contracted) state and a board supporting frame member during inspection.
Figure 6B:
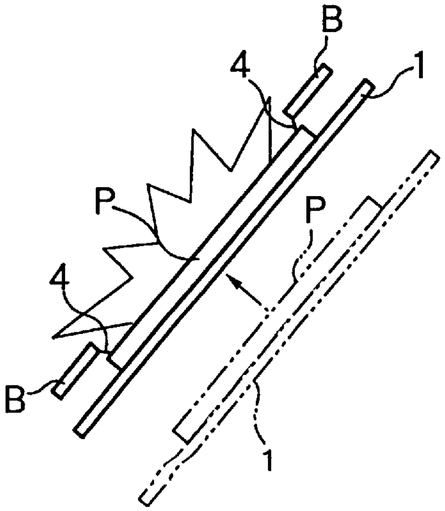
FIG. 6(B) is a sectional view thereof.

One preferred example of the probe block supporting frame member 2 is shown in FIGS. 7 to 10, in which frame sections 12, 13, 14, 15 at four sides are cross assembled so that the probe block supporting frame member 2 can be expanded and contracted in the plane of the frame member 2, as shown in FIG. 3. Another preferred example of the probe block supporting frame member 2 is shown in FIGS. 4 to 6, in which the frame sections 12, 13, 14, 15 are separated and independent such that the probe block supporting frame member 2 can be expanded and contracted.

A driving mechanism for enlarging (expanding) and reducing (contracting) the frame materials 12 to 15 comprises a motor 6, a ball screw 7 rotated by the motor 6, and a nut 8 threadingly engaged with the ball screw 7 and attached to the frame sections 12, 13, 14, 15. When the ball screw 7 is rotated by the motor 6, the nut 8 and the frame sections 12 to 15 are advanced or retracted depending on the direction of rotation. An amount of advancement or retraction is set by the number of rotations of the ball screw 7. Thus, an amount of enlargement (expansion) and reduction (contraction) of the opening area 16 of the probe supporting frame member 2 is established.

Figure 1:
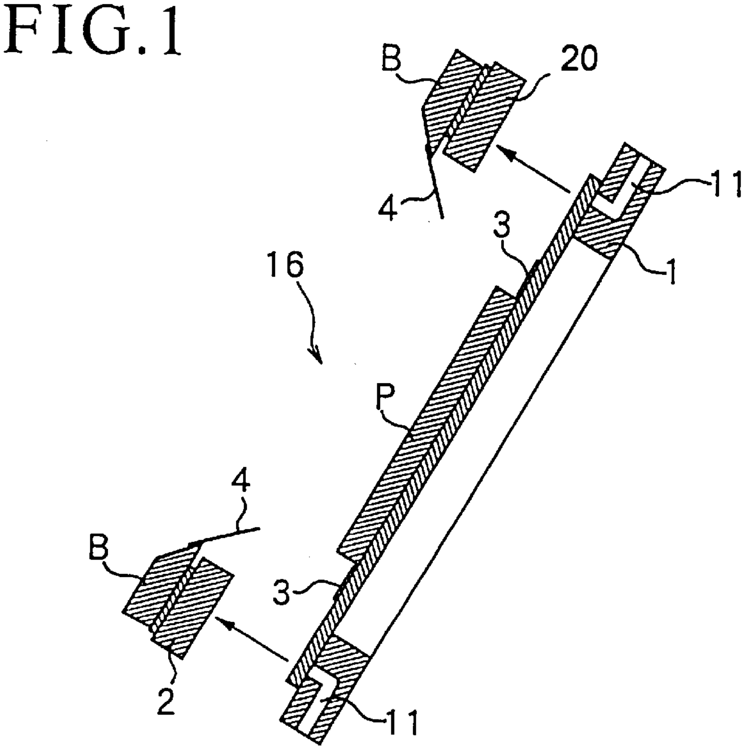
PRIOR ART FIG.1
FIG. 1 is a sectional view showing a relative position between a conventional probe supporting frame member and a board supporting frame member, by way of showing a contact releasing state thereof.
Figure 2:
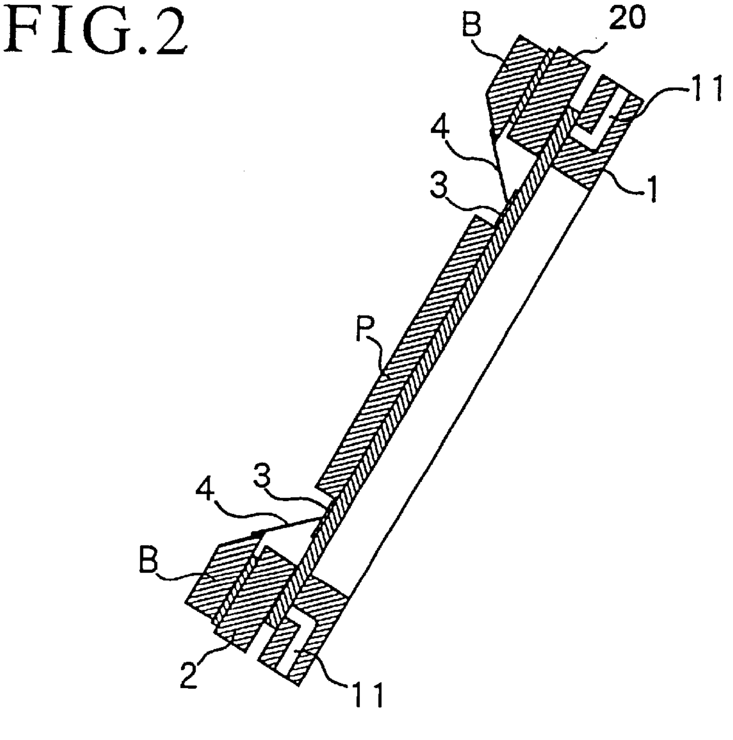
PRIOR ART FIG.2
FIG. 2 is a sectional view showing a relative position between a conventional probe supporting frame member and a board supporting frame member, by way of showing a contacting state thereof.
Figure 3:
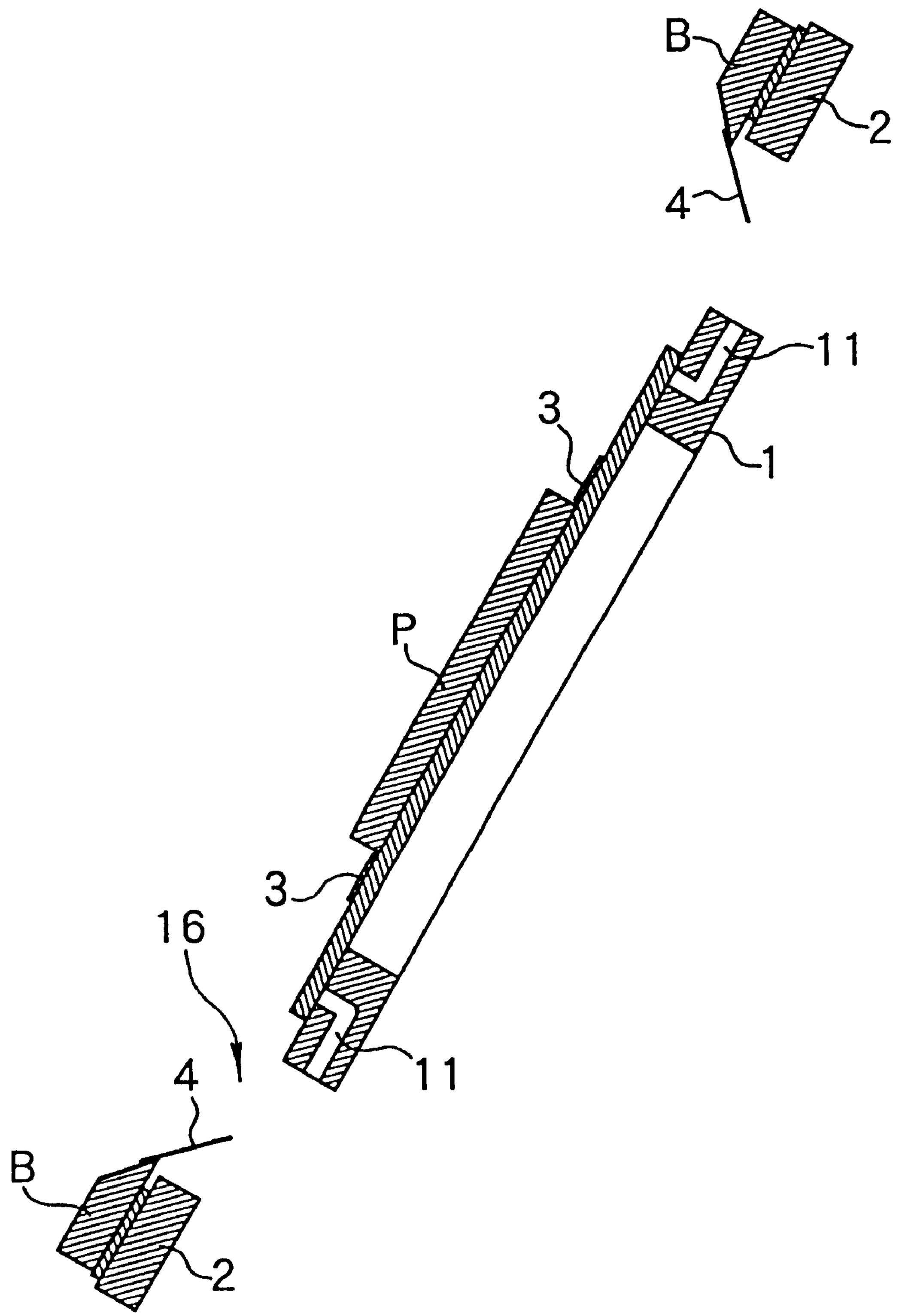
FIG. 3 is a sectional view showing a relative arrangement of a probe supporting frame member and a board supporting frame member during the exchanging of a display board or a circuit board.

On the other hand, the board supporting frame member 1 shown in FIGS. 1 to 10 is supported by a driving mechanism which is advanced forward and retracted backward. As shown in FIGS. 1–3, the board supporting frame member 1 has a plurality of suction holes 11 which are open at a panel supporting surface and spaced in an array in a longitudinal direction. Two to four sides of the display board or the circuit board P are sucked toward the board supporting frame member by a vacuum in the suction holes 11 so that the board P is attachable and detachable.

As shown in FIGS. 4–8, the frame sections 12 to 15 composing the probe supporting frame member 2 are retracted to enlarge the opening area 16 defined by the frame sections 12 to 15. The board supporting frame member 1 is relatively advanced in a direction orthogonal to the direction of movement of the frame member 2, as shown in FIGS. 4B and 4C. Due to advancement of the board supporting frame member 1, the display board or the circuit board P protrudes forward of a distal end of the terminal 4 of the probe block B through the enlarged opening area 16, so that the display board or the circuit board P supported on the board supporting frame member 1 can be exchanged with another board.

Under most ordinary practice, the relative advancement of the board supporting frame member 1 is made by directly advancing the board supporting frame member 1 forward. However, there are two other methods, including one in which the probe supporting frame member 2 is retracted backward so that the board supporting frame member 1 protrudes forward, and one in which both the probe supporting frame member 2 and the board supporting frame member 1 are moved so that the board supporting frame member 1 protrudes forward.

The procedure for attaching, inspecting and exchanging the display board or the circuit board P using the separated independent type probe supporting frame member 2 of FIGS. 4 to 6 will be described hereinafter. The exchanging procedure will be described with reference to FIG. 4 first.

Figure 4A:
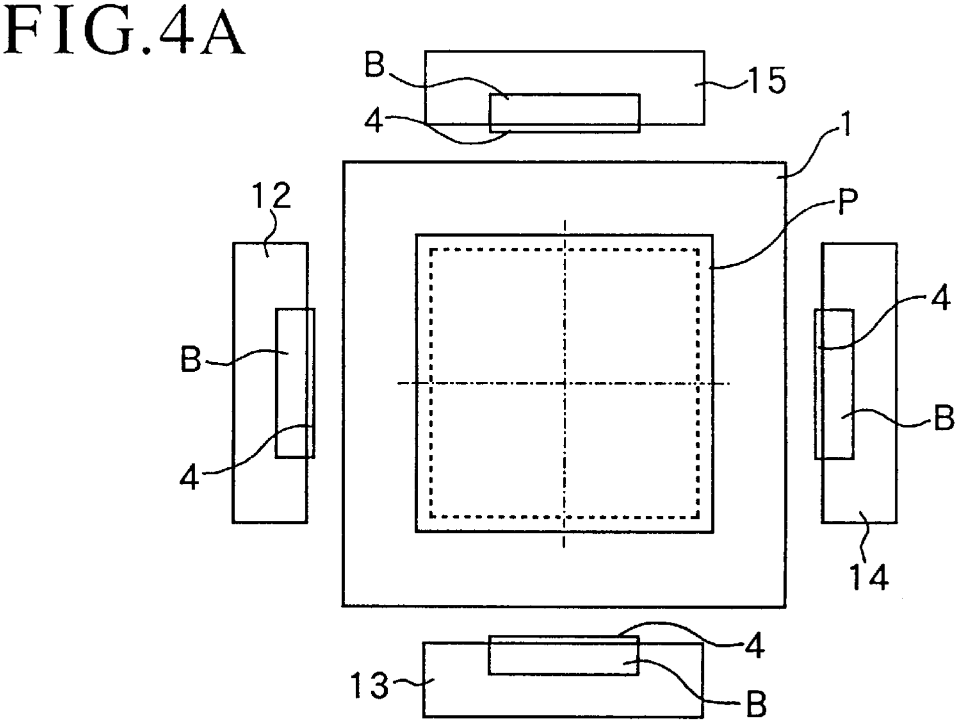
FIG. 4(A) is a front view showing a relative arrangement between a separate type probe supporting frame member which is in an enlarged (expanded) state and a board supporting frame member.
Figure 4B:
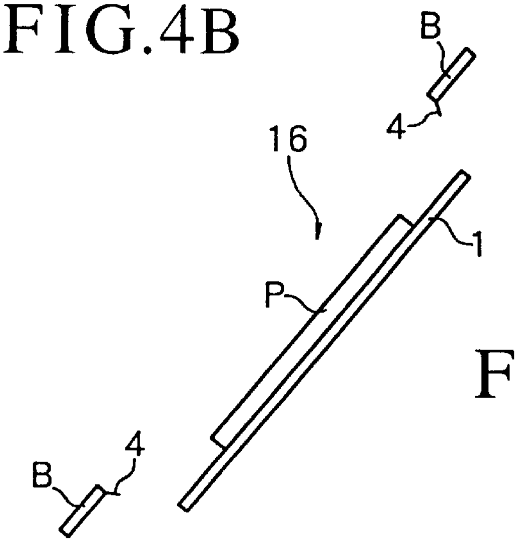
FIG. 4(B) and 4(C) are sectional views showing a relative arrangement between a separate type probe supporting frame member which is in an enlarged state and a board during the exchanging of the board.
Figure 4C:
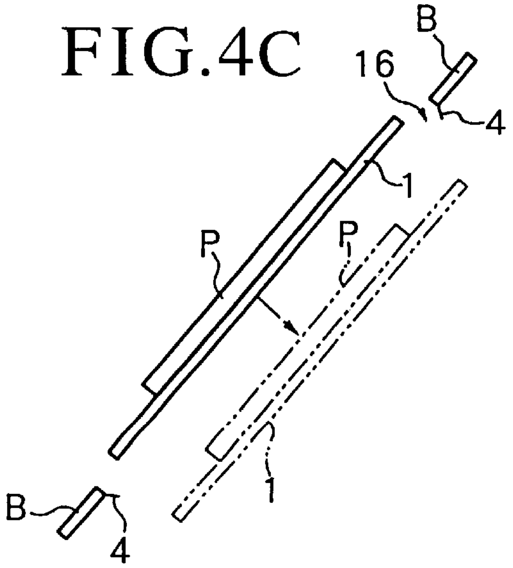

As shown in FIGS. 4(A) through 4(C), the frame sections 12 to 15 are arranged so as to form and surround an opening area 16. As shown in FIGS. 4(A) and 4(B), the frame sections 12 to 15 at the four sides of the probe supporting frame member 2 are retracted on an open surface of the frame member from a reduction (contraction) position (inspection position) by the driving mechanism, thereby enlarging the opening area 16 so as to be larger than the board supporting frame member 1.

As shown in FIGS. 3, 4(B) and 4(C), the board supporting frame member 1 is advanced in a direction orthogonal to the plane of the frame member from the rear standby position so that the display board or the circuit board P protrudes forward together with the board supporting frame member 1. That is to say, due to enlargement (expansion) of the probe supporting frame member 2, the board supporting frame member 1 can be advanced to a position at which the terminal 4 does not interfere with the display board or the circuit board P. Alternatively, due to enlargement of the probe supporting frame member 2, the board supporting frame member 1 can be advanced to a position at which the terminal 4 does not interfere with the board P and the board supporting frame member 1. Then, the board supporting frame member 1 can be advanced so that at least the board P protrudes to the front surface side of the terminal 4 through the enlarged opening area 16 and is located at an exchange position.

In the exchange position, the sucking retention of the board P is released to allow removal of the board P from the board supporting frame member 1. Otherwise, the board P is removed from the board supporting frame member 1 without releasing the sucking retention, and then the sucking retention is released.

Then, a new display board or a new circuit board P is placed on the board supporting frame member 1 and suckingly retained. Subsequently, the board supporting frame member 1 is retracted in a direction orthogonal to the open surface of the frame member 2 so as to be located at a rear standby position.

The inspecting procedure will now be described with reference to FIGS. 5 and 6. After the board supporting frame member 1 is retracted to the standby position indicated by an imaginary line of FIG. 4(C), the frame sections 12 to 15 composing the probe supporting frame member 2 are, as shown in FIG. 5, advanced into the open area of the frame member 2 to reduce the opening area 16 of the probe supporting frame member 2 so that the terminal 4 of the probe block B is located above the corresponding electrode pad 3.

Then, as shown in FIGS. 2 and 6, the board supporting frame member 1 is moved forward in a direction orthogonal to the open surface of the frame member 2 from the rear standby position so that the electrode pads 3 of the display board or the circuit board P are pressed into contact with the corresponding terminals 4 of the probe block B. In that state, electric current is supplied to carry out an inspection. After the completion of inspection, the board supporting frame member 1 is retraced again to the rear standby position. Then, as described with reference to FIG. 4, the probe supporting frame member 2 is enlarged (expanded) and the board supporting frame member 1 is advanced to the exchange position so that the board P can be exchanged.

As previously mentioned, if the probe supporting frame member 2 is retracted to a position where at least the distal end portion of each terminal 4 does not interfere with the corresponding display board or the circuit board P, the exchange can be carried out within the inspection space.

The procedure for cross assembling the probe supporting frame member 2 such that the probe supporting frame member 2 can be expanded and contracted and the exchange of the display board or the circuit board P is carried in that state. The probe supporting frame member 2 comprises four cross assembled frame sections 12 to 15 composing the four sides.

One pair of opposing frame sections 12, 14 are movably supported for advancement and retraction along the plane of the frame member 2 in an X axis direction by the driving mechanism, and the other pair of opposing frame sections 13, 15 are movably supported for advancement and retraction along the plane of the frame member 2 in a Y axis direction by the driving mechanism.

A first end of the frame section 13 is cross assembled with an inner side of a second end of the adjoining frame section 12, and a first end of the frame section 14 is cross assembled with an inner side of the other (second) end of the frame section 13. Similarly, a first end of the frame section 15 is cross assembled with an inner side of the other (second) end of the frame material 14 and the first end of the frame material 12 is cross assembled with an inner side of the other (second) end of the frame material 15.

Figure 9:
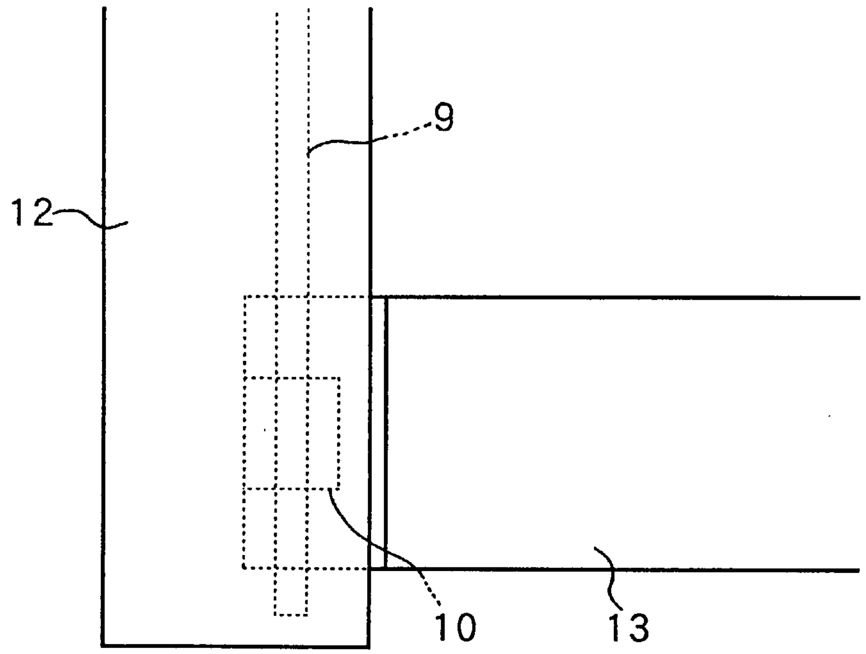
FIG. 9 is an enlarged front view of a cross assembly portion of a crossed assembled panel supporting frame member.
Figure 10:
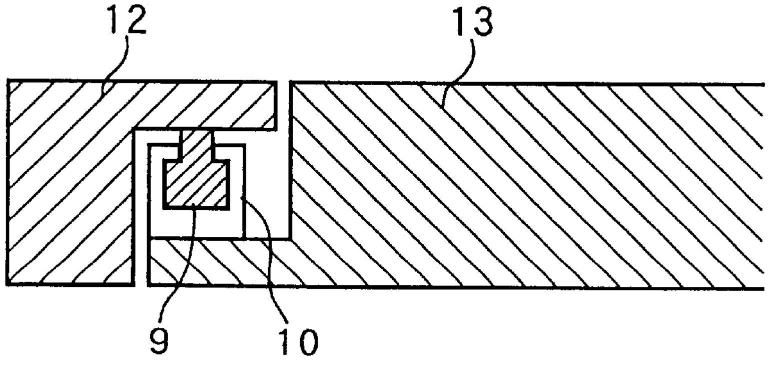
FIG. 10 is an enlarged sectional view of across assembly portion of a cross assembled panel supporting frame member.

More specifically, as shown in FIGS. 9 and 10, a rail 9 attached to and extending in a Y axis direction along inner sides of the frame section 12 and the frame section 14 is disposed between the mutually orthogonal frame sections 12 and 13 and between the mutually orthogonal frame sections 14 and 15. On the other hand, a slider element 10 for slidingly engaging the rail 9 is attached to the frame section 13 and the frame section 15. Due to this arrangement, when the slider element 10 is slidingly moved along the rail 9, the frame section 13 and the frame-section 15 are guided to move in the Y axis direction.

Likewise, a rail 9 attached to and extending in an X axis direction along inner sides of the frame section 13 and the frame section 15 is disposed between the frame sections 13 and 14 and between the frame sections 13 and 15. On the other hand, a slider element 10 for slidingly engaging the rail 9 is attached to the frame section 14 and the frame section 12. Due to this arrangement, when the slider element 10 is slidingly moved along the rail 9, the frame section 14 and the frame section 12 are guided to move in the X axis direction.

A driving mechanism for expanding and contracting (i.e., advancing and retracting) the frame sections 12 to 15 comprises a motor 6, a ball screw 7 rotated by the motor 6 and a nut 8 threadingly engaged with the ball screw 7 and attached to the frame sections 12 to 15. When the ball screw 7 is rotated by the motor 6, the nut 8 and the frame sections 12 to 15 are advanced or retracted depending on the direction of rotation. The amount of advancement or retraction is determined by the number of rotations of the ball screw 7. Thus, an amount of expansion and contraction of the opening area 16 of the probe supporting frame member 2 is established.

On the other hand, the board supporting frame member 1 is supported by a driving mechanism which is advanced forward and retracted backward along an axis orthogonal to the axes along which frame sections 12 to 15 move. The board supporting frame member 1 has a plurality of suction holes 11 which are open at a panel supporting surface and spaced apart in an array in a longitudinal direction. Two to four sides of the display board or the circuit board P are suckingly retained by a vacuum applied by the suction holes 11 so that the board P is attachable and detachable.

The frame sections 12 to 15 composing the probe supporting frame member 2 are retracted to enlarge the opening area 16 defined by the frame sections 12 to 15, and the board supporting frame member 1 is advanced in a relative manner. Due to advancement of the board supporting frame member 1, the display board or the circuit board P protrudes forward of a distal end of the terminal 4 of the probe block B through the enlarged opening area 16, so that the display board or the circuit board P supported on the board supporting frame member 1 can be exchanged with another board.

Undermost ordinary practice, the relative advancement of the board supporting frame member 1 is made by directly advancing the board supporting frame member 1 forward. However, there are two other methods, including one in which the probe supporting frame member 2 is retracted backward to allow the board supporting frame member 1 to protrude forward, and one in which both the probe supporting frame member 2 and the board supporting frame member 1 are moved to allow the board supporting frame member 1 to protrude forward.

The procedure for attaching, inspecting and exchanging the display board or the circuit board P using the cross assembled probe supporting frame member 2 will be described hereinafter with reference to FIGS. 7 and 8.

As shown in FIG. 7, when the frame section 12 is advanced through the open area in the X axis direction by the driving mechanism, the frame section 13 is also moved in the X axis direction through the cross assembly portion. When the frame section 13 is advanced through the open area in the Y axis direction by the driving mechanism, the frame section 14 is also moved in the Y axis direction through the cross assembly portion. When the frame section 14 is advanced through the open area in the X axis direction by the driving mechanism, the frame section 15 is also moved in the X axis direction through the cross assembly portion. When the frame section 15 is advanced through the open area in the Y axis direction by the driving mechanism, the frame section 12 is also moved in the Y axis direction through the cross assembly portion. Thus, due to the movement mentioned above, the probe supporting frame member 2 is placed in the inspection position, and the opening area 16 of the probe supporting frame member 2 is reduced to form a board inspection area.

After the probe supporting frame member 2 is placed in the board inspection position, as shown in FIG. 6, the board supporting frame member 1 is advanced in a direction orthogonal to the plane of the frame member 2 from the rear standby position, the electrode pads 3 of the board P are pressed into contact with the corresponding terminals 4 and inspection is carried out in that state.

On the other hand, as shown in FIG. 8, when the frame section 12 is retracted away from the open area in the X axis direction by the driving mechanism, the frame section 13 is also moved in the X axis direction through the cross assembly portion. When the frame section 13 is retracted away from the open area in the Y axis direction by the driving mechanism, the frame section 14 is also moved in the Y axis direction through the cross assembly portion. When the frame section 14 is retracted away from the open surface in the X axis direction by the driving mechanism, the frame section 15 is also moved in the X axis direction through the cross assembly portion. When the frame section 15 is retracted away from the open surface in the Y axis direction by the driving mechanism, the frame section 12 is also moved in the Y axis direction through the cross assembly portion. Thus, due to the movement mentioned above, the opening area 16 of the probe supporting frame member 2 is expanded to form a board exchange position.

After the probe supporting frame member 2 is retracted to the board exchange position, as shown in FIG. 4(C) and 3, the board supporting frame member 1 is advanced in a direction orthogonal to the plane of the frame member 2 from the board standby position, so that at least the board P protrudes through the enlarged opening area 16 to a position where it does not interfere with the distal end of the terminal 4. Then the board can be exchanged with a new one in that state.

According to the present invention, the display board or the circuit board can be exchanged in the same occupation space soon after inspection, and no side space for the exchange, which is required in the prior art, is needed. Thus, the apparatus for inspecting a display board or a circuit board can greatly be miniaturized.

While one preferred embodiment of an apparatus for inspecting a display board or a circuit board according to the present invention has thus far been described with reference to the drawings, it should be borne in mind that such an embodiment is merely illustrative of the gist of the present invention and is accordingly subject to modification and change.

What is claimed is:

1. An inspection apparatus comprising:

a probe-supporting frame member for supporting an inspection probe block having an inspection terminal thereon, said probe-supporting frame member including a plurality of frame sections arranged so as to form and surround an opening area, said frame sections being operable to move within a plane of said probe-supporting frame member in an advancing direction so as to contract said probe-supporting frame member into an inspection position, and said frame sections being operable to move within the plane of said probe-supporting frame member in a retracting direction so as to expand said probe-supporting frame member into an exchange position; and a board supporting frame member for supporting one of a display board and a circuit board to be inspected, said board supporting frame member being operable to move orthogonal to the plane of said probe-supporting frame member in a retracting direction so as to place said board supporting frame member in a standby position, and being operable to move orthogonal to the plane of said probe-supporting frame member in an advancing direction so as to place said board supporting frame member in one of an inspection position, whereat an electrode pad of the one of a display board and a circuit board supported by said board supporting frame member is pressed into contact with the inspection terminal of the inspection probe block supported by said probe-supporting frame member in the inspection position, and an exchange position, whereat the one of a display board and a circuit board supported by said board supporting frame member protrudes through the opening area formed by said frame sections and through the plane of said probe-supporting frame member.

2. The inspection apparatus of claim 1, wherein said probe-supporting frame member includes a driving mechanism for moving each of said frame sections in the advancing direction and the retracting direction, said driving mechanism comprising a motor and a ball screw connected to each of said frame sections and operable to be rotated by said motor such that a direction of movement of each of said frame sections is based on a direction of rotation of said ball screw.

3. The inspection apparatus of claim 2, wherein said probe-supporting frame member comprises four cross-assembled and interlocked frame sections, each of said frame sections having a first end, a second end opposite said first end, and an inner side facing the opening area, each of said frame sections including a slider element at said first end and including a rail arranged along said inner side at said second end such that said slider element slidably engages said rail of an adjacent one of said frame sections so that said first end of each of said frame sections slides along said inner side of an adjacent one of said frame sections as said frame sections move in the advancing direction and in the retracting direction.

4. The inspection apparatus of claim 1, wherein said probe-supporting frame member comprises four cross-assembled and interlocked frame sections, each of said frame sections having a first end, a second end opposite said first end, and an inner side facing the opening area, each of said frame sections including a slider element at said first end and including a rail arranged along said inner side at said second end such that said slider element slidably engages said rail of an adjacent one of said frame sections so that said first end of each of said frame sections slides along said inner side of an adjacent one of said frame sections as said frame sections move in the advancing direction and in the retracting direction.

* * * * *